United States Patent
Lee

(10) Patent No.: US 7,200,065 B2
(45) Date of Patent: Apr. 3, 2007

(54) INPUT/OUTPUT CIRCUIT

(75) Inventor: Ihl-Ho Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 123 days.

(21) Appl. No.: 11/022,119

(22) Filed: Dec. 23, 2004

(65) Prior Publication Data

US 2006/0002222 A1  Jan. 5, 2006

(30) Foreign Application Priority Data

Jun. 30, 2004  (KR) ...................... 10-2004-0049912

(51) Int. Cl.
*G11C 5/14* (2006.01)
(52) U.S. Cl. ................... 365/226; 365/230.03
(58) Field of Classification Search ........... 365/185.24, 365/185.25, 226, 228, 206, 227, 185.11, 185.23, 365/189.09, 230.03, 230.06
See application file for complete search history.

(56) References Cited

U.S. PATENT DOCUMENTS

| | | | |
|---|---|---|---|
| 5,537,362 A * | 7/1996 | Gill et al. ................. | 365/233.5 |
| 5,930,196 A | 7/1999 | Yim | |
| 6,163,493 A * | 12/2000 | Yamagata et al. .......... | 365/226 |
| 6,275,430 B1 | 8/2001 | Ka | |
| 6,381,188 B1 * | 4/2002 | Choi et al. ................... | 365/222 |
| 6,385,107 B1 * | 5/2002 | Bedarida et al. ............ | 365/206 |
| 6,421,294 B2 | 7/2002 | Hidaka | |
| 6,597,621 B2 | 7/2003 | Tsuji et al. | |
| 6,654,275 B2 * | 11/2003 | Forbes ........................ | 365/154 |
| 6,842,382 B2 * | 1/2005 | Kim et al. ............. | 365/189.09 |
| 2003/0053354 A1 * | 3/2003 | Kliewer et al. ............. | 365/200 |
| 2003/0223277 A1 * | 12/2003 | Origasa ................. | 365/189.11 |
| 2005/0024911 A1 * | 2/2005 | Kim ........................... | 365/100 |
| 2006/0092744 A1 * | 5/2006 | Lee ............................ | 365/226 |

FOREIGN PATENT DOCUMENTS

| | | |
|---|---|---|
| JP | 2001-052480 | 2/2001 |
| KR | 1999-66422 | 8/1999 |

* cited by examiner

*Primary Examiner*—Anh Phung
*Assistant Examiner*—Alexander Sofocleous
(74) *Attorney, Agent, or Firm*—Blakely Sokoloff Taylor & Zafman

(57) ABSTRACT

A semiconductor memory device is divided into a core region where memory cells are formed and a peripheral region where an input/output line circuit is formed. The input/output line circuit of the semiconductor memory device is operable without affecting other external devices and being affected by noise from other external devices along with improved power dissipation. The semiconductor memory device includes: a core voltage generator for supplying a core voltage to the core region as a driving voltage; an internal voltage generator for supplying an internal voltage to the peripheral region as a driving voltage; and a line voltage generator for supplying a line voltage to the input/output line circuit as a driving voltage. In this manner, a stable supply of the driving voltage is achieved.

16 Claims, 12 Drawing Sheets

//INPUT/OUTPUT CIRCUIT

FIELD OF THE INVENTION

The present invention relates to an input/output circuit in a semiconductor memory device; and more particularly, to an input/output circuit with separate power supply devices.

DESCRIPTION OF RELATED ARTS

Generally, a semiconductor memory device includes a plurality of input pins for communicating data and instructions with external devices and a plurality of memory cells for storing data. At this time, within the semiconductor memory device, a region that is in periphery of the plurality of input pins is called a peripheral region, while a region in which there are a plurality of memory cells is called a core region. The semiconductor memory device includes global input/output lines for transferring data between the peripheral region and the core region.

In a recent semiconductor memory device, as a device operation speed and a capacitance increase, the number of the global input/output lines and amounts of data to be transmitted through the individual global input/output lines increase proportionally. Also, in respect of a structure of the semiconductor memory device, the peripheral region and the core region are spaced further apart within the semiconductor memory device, and thus, the global input/output line has a greater resistance in proportion to the length of the global input/output line. As a result, a high level of driving power is required to drive the global input/output lines.

FIG. 1 is a block diagram showing a read path of a conventional semiconductor memory device. FIG. 2 is a block diagram showing a write path of the conventional semiconductor memory device.

Referring to FIG. 1, the semiconductor memory device receives a power voltage VDD from an external source and supplies the power voltage VDD to a core voltage generator 12, an internal voltage generator 14 and an interface voltage generator 16. The core voltage generator 12 inputted with the power voltage VDD generates a core voltage VCORE used at a bank 10 including a plurality of memory cells. Also, the internal voltage generator 14 generates a predetermined level of an internal voltage VINT based on the external power voltage VDD, and this predetermined level of the internal voltage VINT is employed as a driving voltage of a plurality of global input/output lines GIO0 to GIO3. Lastly, the interface voltage generator 16 generates an interface voltage VDDQ used for an output buffer block 28. Herein, the interface voltage VDDQ and the power voltage VDD have the same voltage level. Therefore, the power voltage VDD can be supplied to the output buffer block 28 without employing the interface voltage generator 16.

The internal voltage VINT is used as a driving voltage for circuit modules in the peripheral region. As shown in FIG. 1, the circuit module includes: an input/output sense amplifier block 22 including a plurality of input/output sense amplifier units IOSAs for sensing and amplifying data outputted from the memory cells; an output data latch block 24 including a plurality of output data latch units OUTPUT DATA LATCHs for sequentially receiving the amplified data through the aforementioned global input/output lines GIO0 to GIO3, temporarily storing the amplified data into the plurality of output data latch units OUTPUT DATA LATCHs and sequentially outputting the latched data; a voltage level shifter block 26 including a plurality of voltage level shifter units LS for transferring voltage levels of the outputted data; and an output control block 92 for controlling reading and writing operations. Herein, the output data latch units OUTPUT DATA LATCHs includes a number of latch devices formed in a pipe line structure.

FIG. 2 is a block diagram sowing a write path of the conventional semiconductor memory device.

As shown, the semiconductor memory device includes: an input buffer block 38 having a plurality of input buffer units BUFFERs inputted with a data from an external source; an input data latch block 34 having a plurality of input data latch units DATA LATs for latching the inputted data from the input buffer block 38; a write driver block 32 having a plurality of write driver units WDRVs for transferring the inputted data to a bank 10; the plurality of global input/output lines GIO0 to GIO3 for connecting the input data latch block 34 with the write driver block 32; and an input control block 94 for controlling a write operation.

For the write operation, the core voltage generator 12 for supplying a core voltage to the bank 10 and the internal voltage generator 14 for generating a predetermined level of an internal voltage from the external power voltage VDD are used. Although the input buffer block 38 can be supplied with the interface voltage VDDQ generated from the interface voltage generator 16 as shown in FIG. 1, the case of supplying the external power voltage VDD to the input buffer block 38 is illustrated in FIG. 2. Unlike the read operation, for the write operation, it is not necessary to allocate the voltage level sifter units between the input buffer block 38 and the input data latch block 34 because currents are not dissipated when a data in logic "High" is transmitted from a high level of the power voltage VDD into a low level of the internal voltage VINT.

As shown in FIGS. 1 and 2, the global input/output lines GIO0 to GIO3 are commonly used in the read operation and the write operation. Therefore, during the read/write operation, internal voltage devices such as relevant logic circuit modules are used and as a result, the internal voltage generator 14 may be burdened with the supply of the internal voltage VINT for normally driving the global input/output lines GIO0 to GIO3. Also, as the global input/output lines drive, other circuit modules using the internal voltage VINT that becomes unstable may be operated inadequately. Furthermore, the internal voltage generator for supplying a voltage to each module in the peripheral region needs to be activated for a long row address strobe (RAS) time. However, since a high level of power dissipation takes place when the global input/output lines drive takes place for a short column address strobe (CAS) time, it is difficult to effectively operate the internal voltage generator 14.

FIG. 3 is a block diagram showing a read path of a conventional low voltage semiconductor memory device. FIG. 4 is a block diagram showing a write path of the conventional low voltage semiconductor memory device. Herein, the same configuration elements described in FIGS. 1 and 2 are denoted with the same reference numerals, and a detailed description of these elements will be omitted. Also, in the semiconductor memory device, most of peripheral circuits use an external power voltage VDD as a driving voltage.

With reference to FIG. 3, the voltage level shifter block 26 shown in FIG. 1 is not necessary since the external power voltage VDD used as the driving voltage in the peripheral region is identical to an interface voltage VDDQ which is a driving voltage of the output buffer block 28.

With reference to FIG. 4, in the write path, it is not the internal voltage but the external power voltage VDD that is used as a driving voltage for an input data latch block 34 and a write driver block 32 in the peripheral region.

However, when the external power voltage VDD is directly used as a driving voltage for the global input/output lines GIO0 to GIO3, power can not be stably supplied to the global input/output lines GIO0 to GIO3 because of an overload. That is, the power voltage fluctuates. Also, the unstable voltage level affects other circuit modules in the peripheral region, and a power voltage supplied to other external devices may also be affected. As a result, there arises a problem that input/output data are also affected. This problem is also observed in other semiconductor memory devices with input/output terminals packaged within a predetermined size.

SUMMARY OF THE INVENTION

It is, therefore, an object of the present invention to provide an input/output circuit in a semiconductor memory device that can be effectively used without affecting operations of other internal circuit modules.

It is another object of the present invention to provide an input/output circuit in a semiconductor memory device without being affected by noise from external devices.

In accordance with an aspect of the present invention, there is provided a semiconductor memory device including a core region where memory cells are formed and a peripheral region where an input/output line circuit is formed, the semiconductor memory device including: a core voltage generation unit for supplying a core voltage to the core region as a driving voltage; an internal voltage generation unit for supplying an internal voltage to the peripheral region as a driving voltage; and a line voltage generation unit for supplying a line voltage to the input/output line circuit as a driving voltage, whereby a stable supply of the driving voltage is achieved.

In accordance with another aspect of the present invention, there is provided an input/output line circuit, including: a plurality of global input/output lines for use in a read operation serving a role in transferring data from a core region to a peripheral region; an input/output sense amplifier unit for sensing data inputted to a plurality of internal input/output lines of the core region and amplifying the sensed data; a read latch unit for detecting the data transferred to the plurality of global input/output lines, latching the detected data for a predetermined time and outputting the latched data to input/output pins; and a read line voltage generation unit enabled by a read enable signal and inputted with an external power voltage to supply a driving voltage to the input/output sense amplifying unit and the read latch unit.

In accordance with still another aspect of the present invention, there is provided an input/output line circuit, including: a plurality of global input/output lines for use in a write operation serving a role in transferring data from a peripheral region to a core region; a write latch unit for detecting data inputted from input/output pins, latching the detected data and outputting the latched data to the plurality of global input/output lines for use in the write operation; a write driver unit for transferring the data inputted to the plurality of global input/output lines for use in the write operation to a plurality of internal input/output lines of the core region; and a write line voltage generation unit enabled by a write enable signal and inputted with an external power voltage to supply a driving voltage to the write latch unit and the write driver unit.

In accordance with further aspect of the present invention, there is provided an input/output line circuit, including: a plurality of global input/output lines for inputting/outputting data between a core region and a peripheral region; an input/output sense amplifying unit for sensing data inputted to internal input/output lines of the core region and amplifying the sensed data; a read latch unit for detecting the data inputted to the plurality of global input/output lines, latching the detected data for a predetermined time and outputting the latched data to input/output pins; a write latch unit for detecting the data inputted from input/output pins, latching the detected data and outputting the latched data to the plurality of global input/output lines; a write driver unit for transferring the data inputted to the plurality of global input/output lines to the internal input/output lines of the core region; and a line voltage generation unit for supplying a driving voltage to the input/output sense amplifying unit and the read latch unit as the line voltage generation unit is enabled by a read enable signal and inputted with an external power voltage and for supplying a driving voltage to the write latch unit and the write driver unit as the line voltage generation unit is enabled by a write enable signal and inputted with an external power voltage.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

An input/output circuit in accordance with the present invention will be described in detail with reference to the accompanying drawings.

Figure 1:
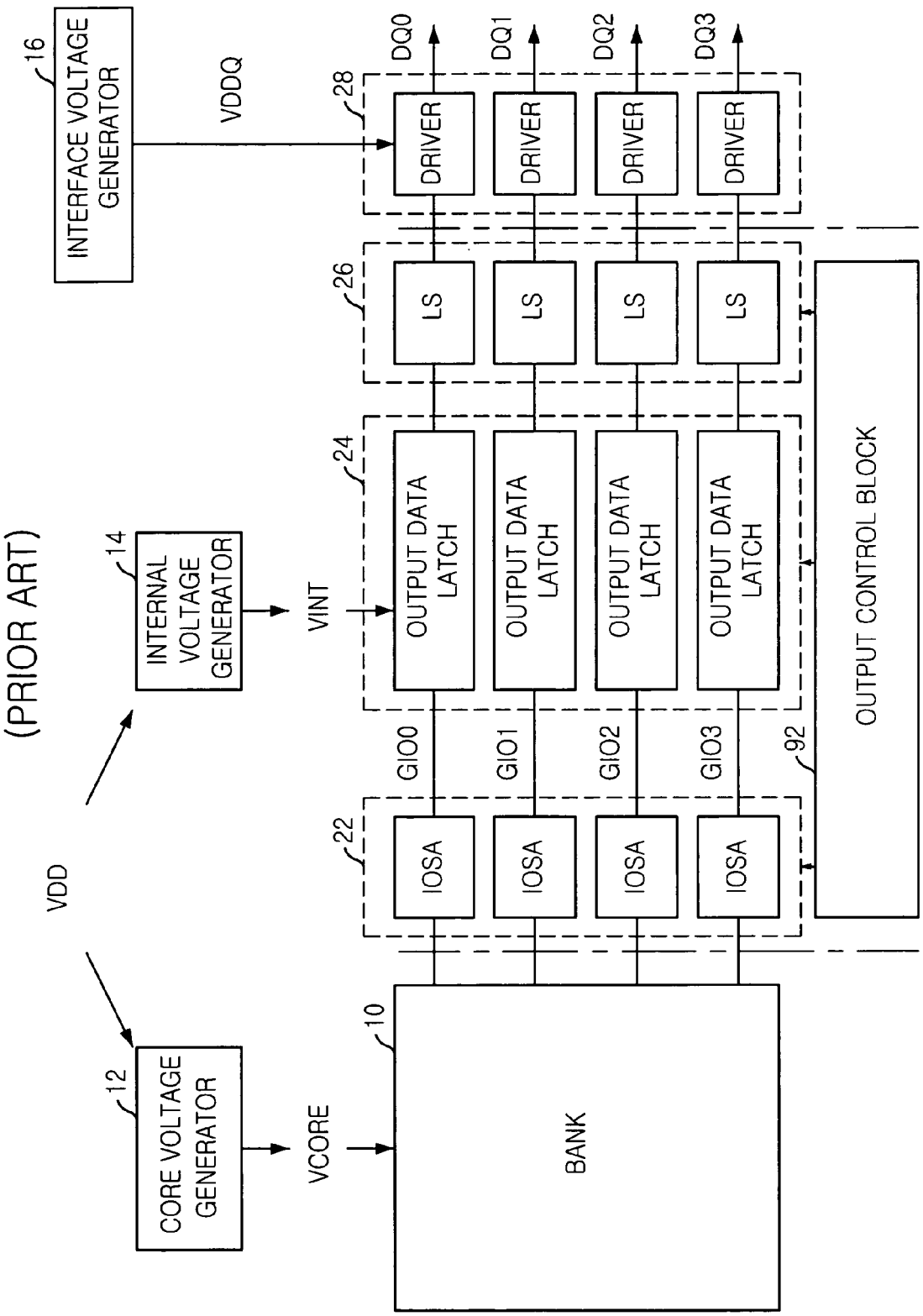
FIG. 1 is a block diagram showing a read path of a conventional semiconductor memory device.
Figure 2:
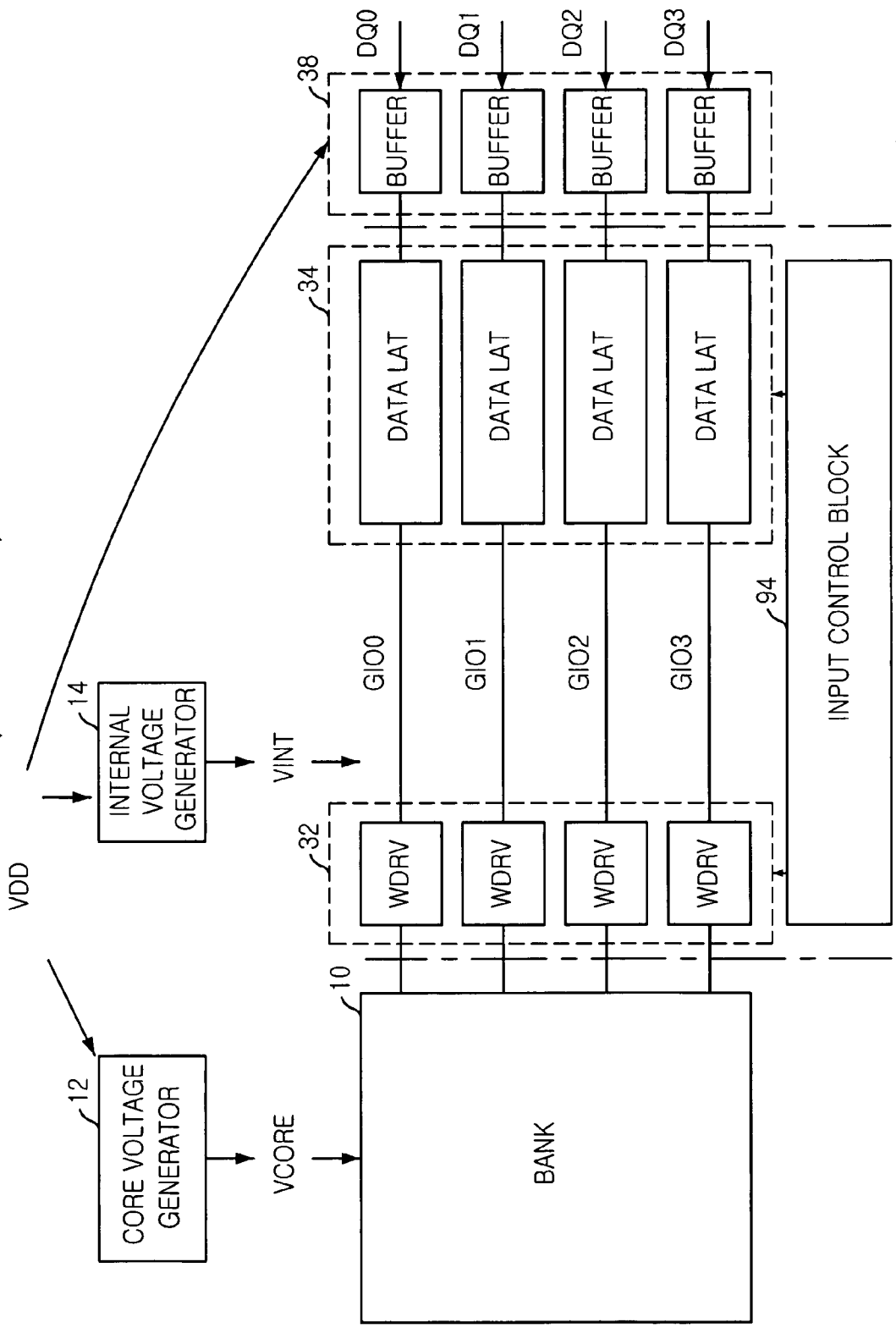
FIG. 2 is a block diagram showing a write path of the conventional semiconductor memory device.
Figure 3:
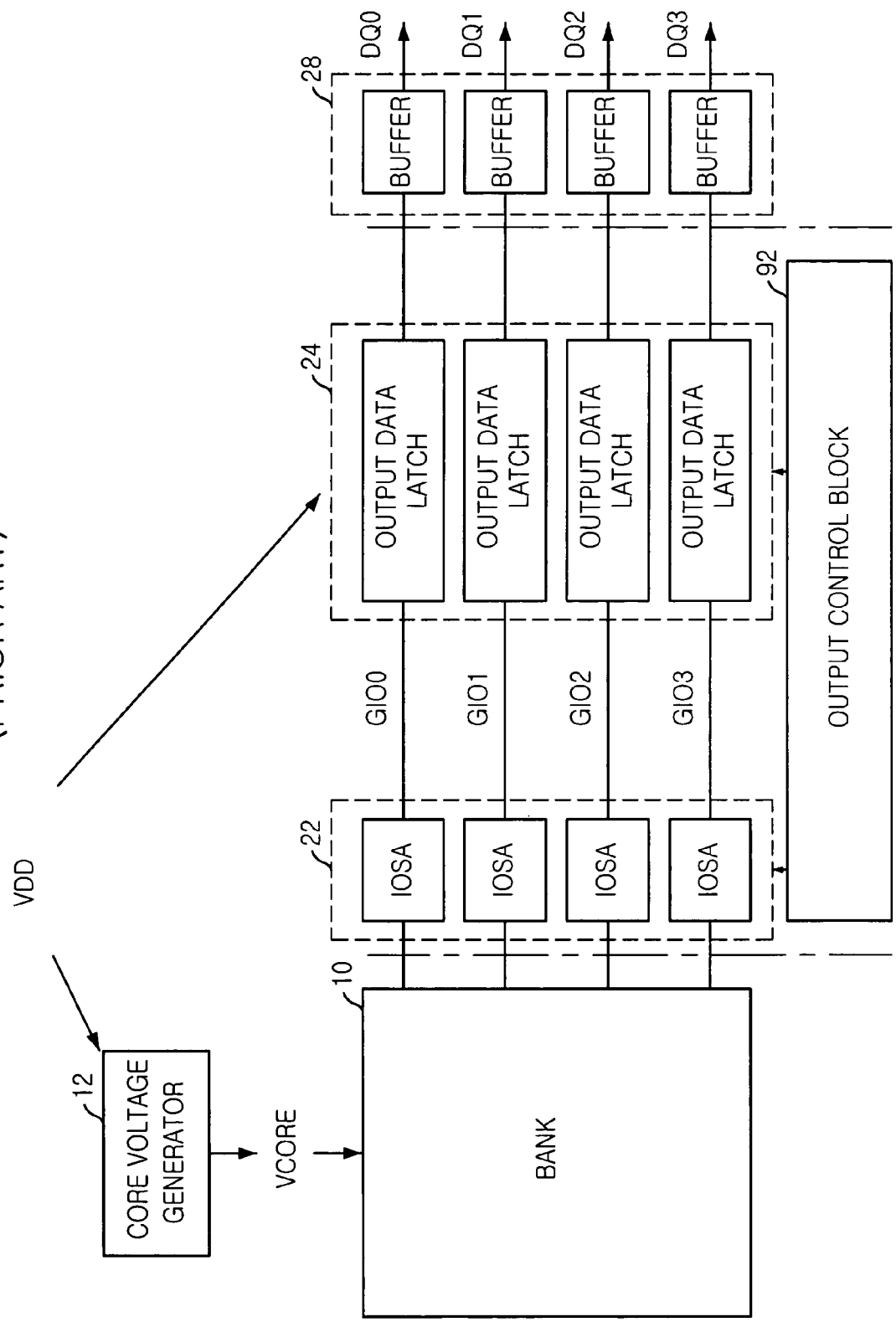
FIG. 3 is a block diagram showing a read path of a conventional low voltage semiconductor memory device.
Figure 4:
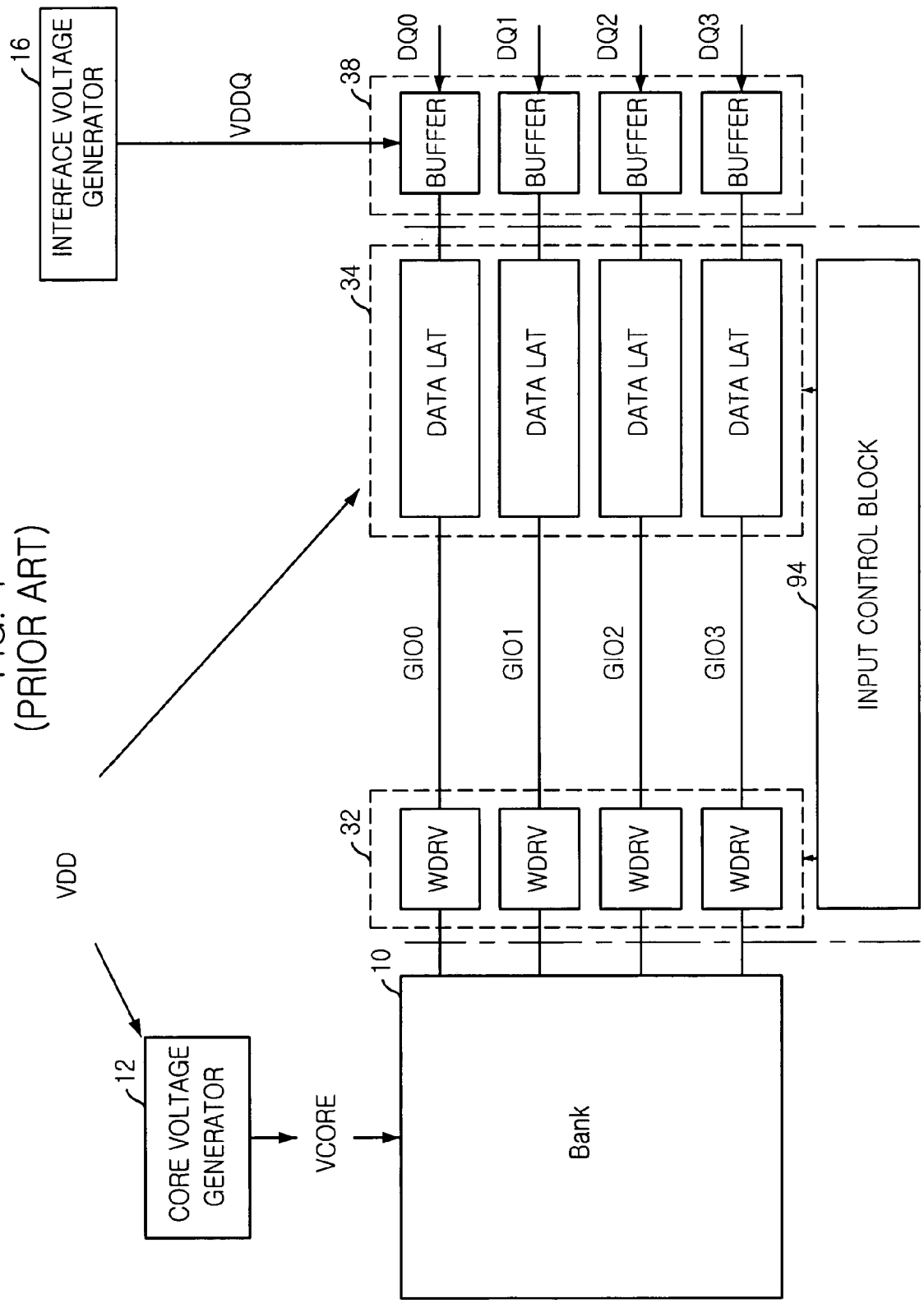
FIG. 4 is a block diagram showing a write path of the conventional low voltage semiconductor memory device.
Figure 5:
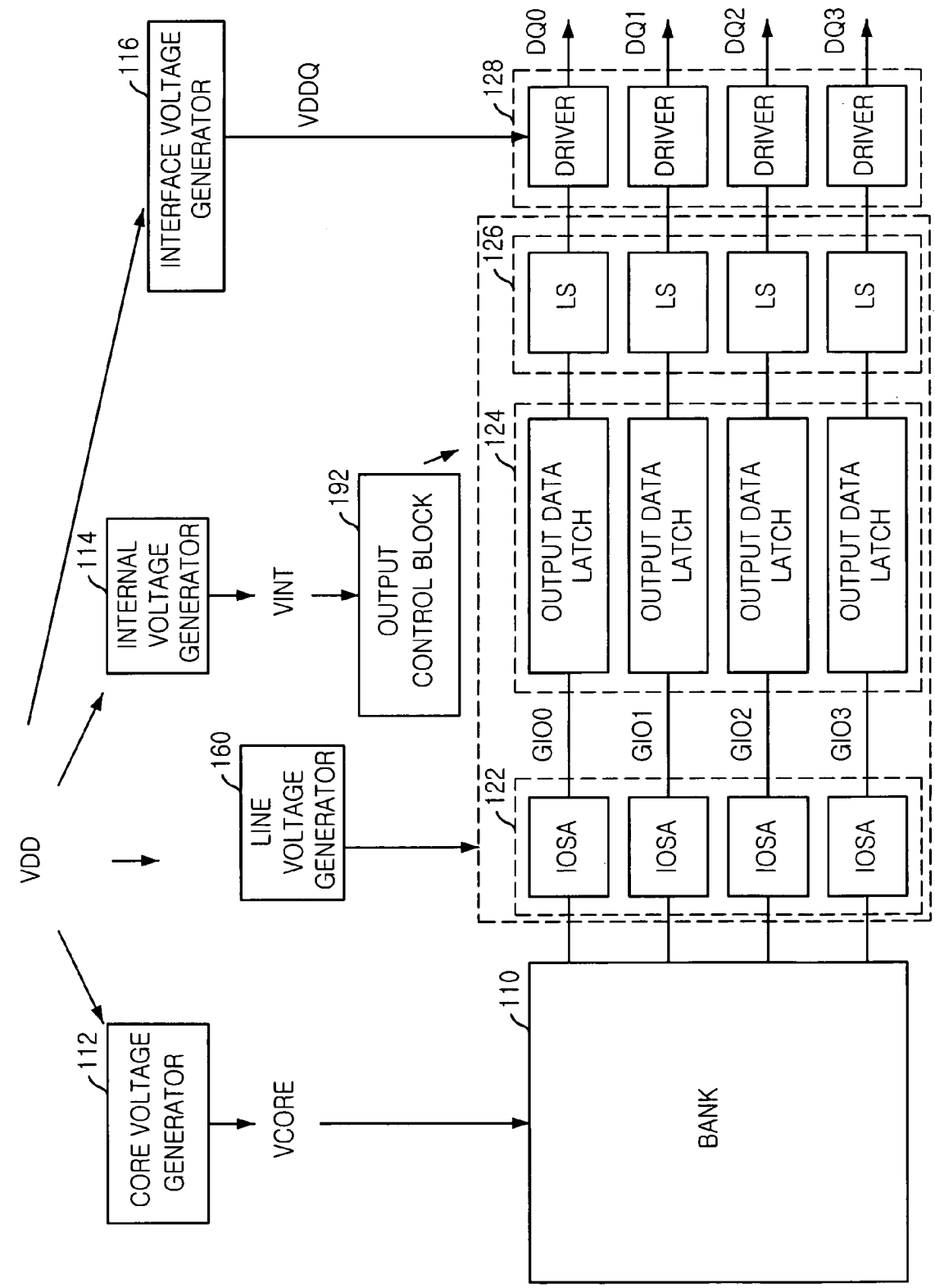
FIG. 5 is a block diagram showing a read path of a semiconductor memory device in accordance with the present invention.

FIG. 5 is a block diagram illustrating a read path of data in a semiconductor memory device in accordance with a preferred embodiment of the present invention.

As shown, the semiconductor memory device includes: a bank 110; a core voltage generator 112; an internal voltage generator 114; an interface voltage generator 116; a line voltage generator 160; an output control block 192; an input/output sense amplifier block 122 including a plurality of input/output sense amplifier units IOSAs; an output data latch block 124 including a plurality of output data latch units OUTPUT DATA LATCHs; a level shifter block 126 including a plurality of level shifter units LSs; and an output buffer block 128 including a plurality of output buffer units DRIVERs.

As for the read path, data stored into the bank 110 in a core region are inputted to the input/output sense amplifier block 122 in response to a read instruction. The data amplified by the input/output sense amplifier block 122 are transmitted through global input/output lines GIO0 to GIO3 to the output data latch block 124, the level shifter block 126 and then to the output buffer block 128 in a peripheral region. Afterwards, the data are transmitted to external devices through input/output pins. Herein, it is necessary to allocate the level shifter block 126 between the output data latch block 124 and the output buffer block 128 because a line voltage VGIO which is a driving voltage for the output data latch block 124 is higher than an interface voltage VDDQ which is a driving voltage for the output buffer block 128.

Hereinafter, a power supply for each structure in the semiconductor memory device, e.g., the dynamic random access memory (DRAM) device, will be described in detail.

The DRAM bank 110 including a plurality of DRAM cells is supplied with a core voltage VCORE generated from the core voltage generator 112, and an internal voltage VINT generated from the internal voltage generator 114 is supplied to the output control block 192 for controlling a read operation. Also, the external output buffer block 128 is supplied with an interface voltage VDDQ generated from the interface voltage generator 116 in order to make an external output level adjusted to a predetermined external signal level.

The line voltage VGIO generated at the line voltage generator 160 is supplied to those configuration elements connected with the global input/output lines GIO0 to GIO3. That is, the line voltage VGIO is supplied as a driving voltage to the input/output sense amplifier block 122, the output data latch block 124 and the level shifter block 126.

Figure 6:
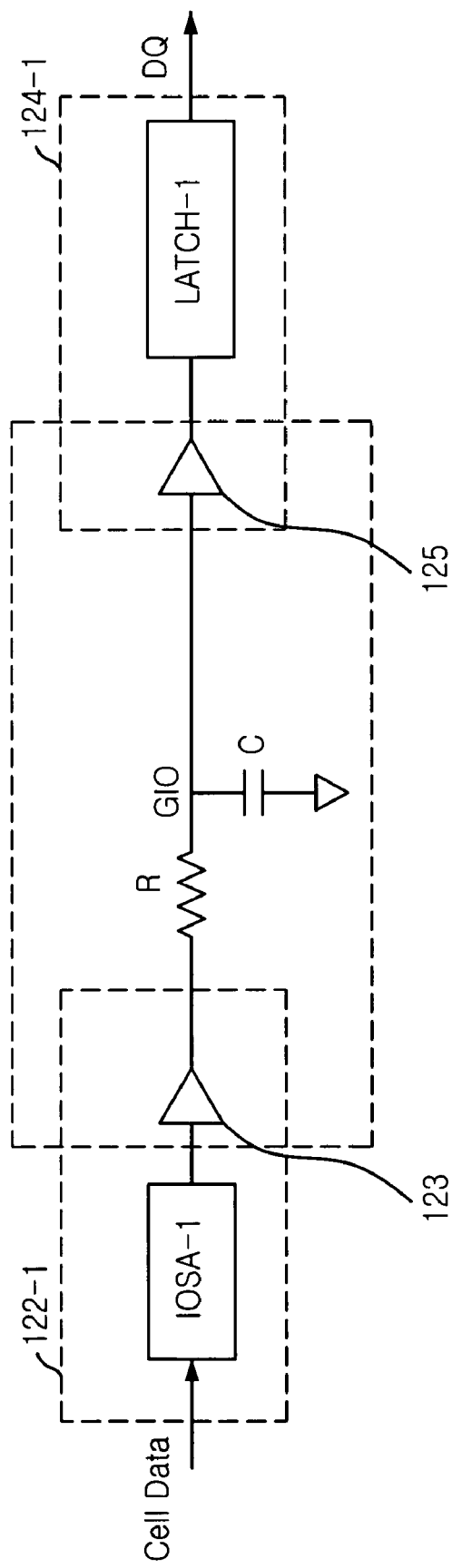
FIG. 6 is a circuit diagram showing an input/output line circuit for use in a read operation in accordance with the present invention.

FIG. 6 is a block diagram illustrating the global input/output lines in the peripheral region of the semiconductor memory device shown in FIG. 5.

It should be noted that only one of the global input/output lines is illustrated in this drawing, and this illustrated global input/output line is expressed with a reference denotation GIO. Thus, only one of the input/output sense amplifier units IOSAs of the input/output sense amplifier block 122 and one of the output data latch units OUTPUT DATA LATCHs of the output data latch block 124 are correspondingly illustrated, and said corresponding input/output sense amplifier unit IOSA and said corresponding output data latch unit OUTPUT DATA LATCH are denoted with a reference numeral 122-1 and 124-1, respectively.

As shown, the input/output sense amplifier unit 122-1, the global input/output line GIO and the output data latch unit 124-1 exist in the peripheral region. Particularly, the input/output sense amplifier unit 122-1 includes an input/output sense amplifiers IOSA-1 for amplifying data outputted from the bank 110 and a first line driver 123, and the output data latch unit 124-1 includes a latch device LATCH-1 for outputting data in response to a read latency by sequentially latching data transmitted through the global input/output line GIO and a first line receiver 125.

Particularly, the global input/output line GIO connecting the input/output sense amplifier unit 122-1 with the output data latch unit 124-1 has high levels of a resistance R and a capacitance C that are not negligible. Thus, for a smooth transmission of data without being affected by the resistance R and the capacitance C, the first line driver 123 and the first line receiver 125 are connected at the initial section and the terminal section of the global input/output lines GIO, respectively.

A line voltage VGIO generated from the line voltage generator 160 is supplied to the above described configuration elements. However, as shown in FIG. 6, it is possible to supply the line voltage VGIO only to the first line driver 123 and the first line receiver 125. That is, the input/output sense amplifier IOSA-1 of the input/output sense amplifier unit 122-1 is supplied with the internal voltage VINT or the external power voltage VDD, and the first line driver 123 is supplied with the line voltage VGIO. Identically, the latch device LATCH-1 of the output data latch unit 124-1 is supplied with the internal voltage VINT or the external power voltage VDD, and the first line receiver 125 is supplied with the line voltage VGIO. In this case, during the read operation, there is an effect of improving a noise problem caused by high levels of the resistance R and the capacitance C of the global input/output line GIO.

Figure 7:
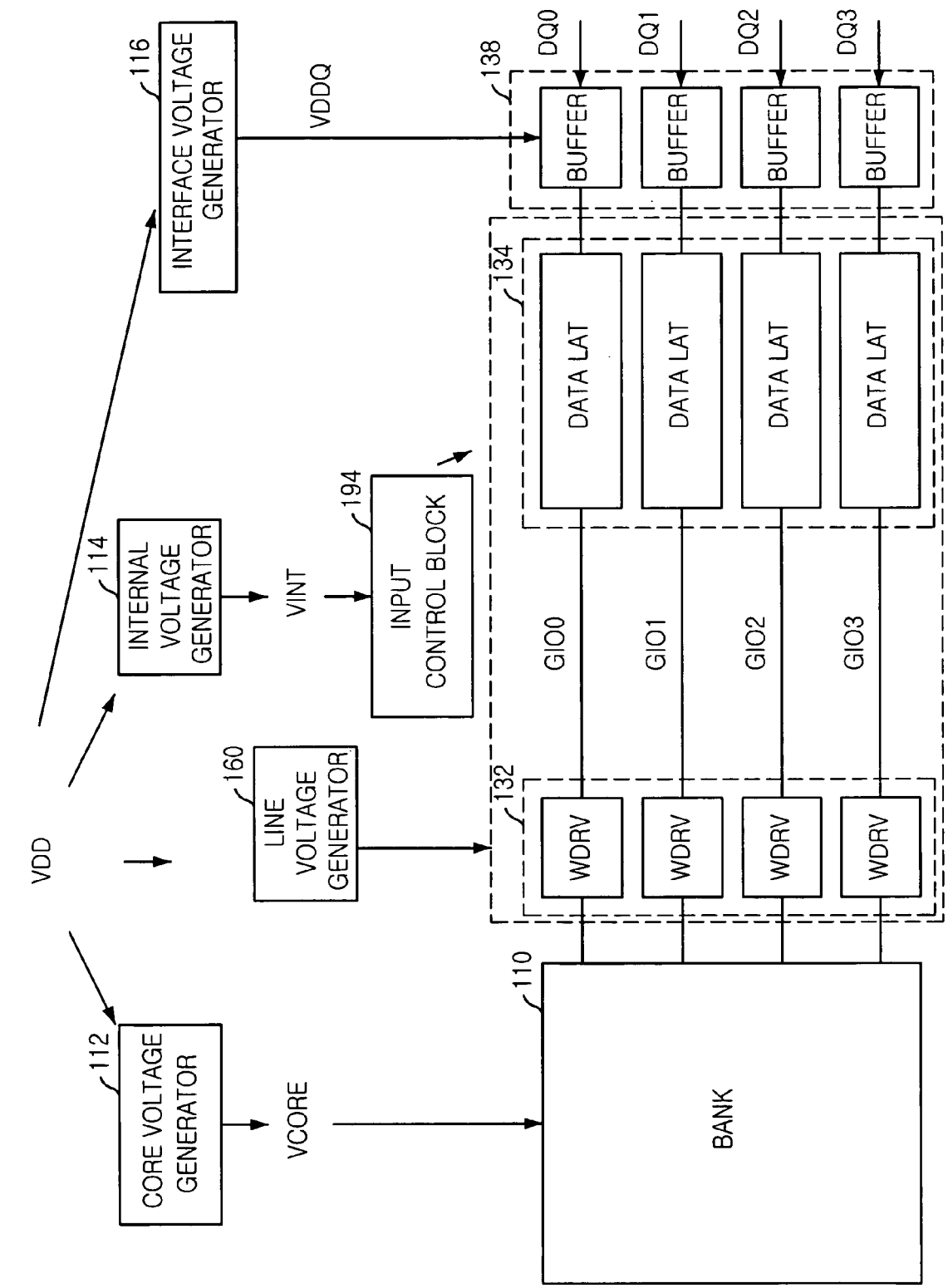
FIG. 7 is a block diagram showing a write path of the semiconductor memory device in accordance with the present invention.

FIG. 7 is a block diagram showing a write path of data in the semiconductor memory device in accordance with the preferred embodiment of the present invention.

As shown, the semiconductor memory device includes: the bank 110; the core voltage generator 112; the internal voltage generator 114; the interface voltage generator 116; the line voltage generator 160; an input control block 194; a write driver block 132 including a plurality of write driver units WDRVs; an input data latch block 134 including a plurality of input data latch units DATA LATs; and an input buffer block 138 including a plurality of input buffer units BUFFERs.

As for the write path, a data externally inputted from input/output pins is buffered by the input buffer block 138 based on a write instruction and then, latched as being inputted into the input data latch block 134. Afterwards, the global input/output lines GIO0 to GIO3 transmit the data from the input data latch block 134 to the write driver block 132, and the write driver block 132 amplifies the transmitted data, which is subsequently stored into an assigned cell of the bank 110 in the core region.

Hereinafter, a power supply to each structure in the DRAM device will be described in detail.

The DRAM bank 110 is supplied with the core voltage VCORE generated from the core voltage generator 112, and the input control block 194 for controlling the write operation is supplied with the internal voltage VINT generated from the internal voltage generator 114. Also, the interface voltage VDDQ generated from the interface voltage generator 116 is supplied to the input buffer block 138 that receives external signals in individual predetermined levels.

The line voltage VGIO generated from the line voltage generator 160 is supplied to those configuration elements connected with the global input/output lines GIO0 to GIO3 for use in the write operation. That is, the line voltage VGIO is supplied to the write driver block 132 and the input data latch block 134 as a driving voltage.

Figure 8:
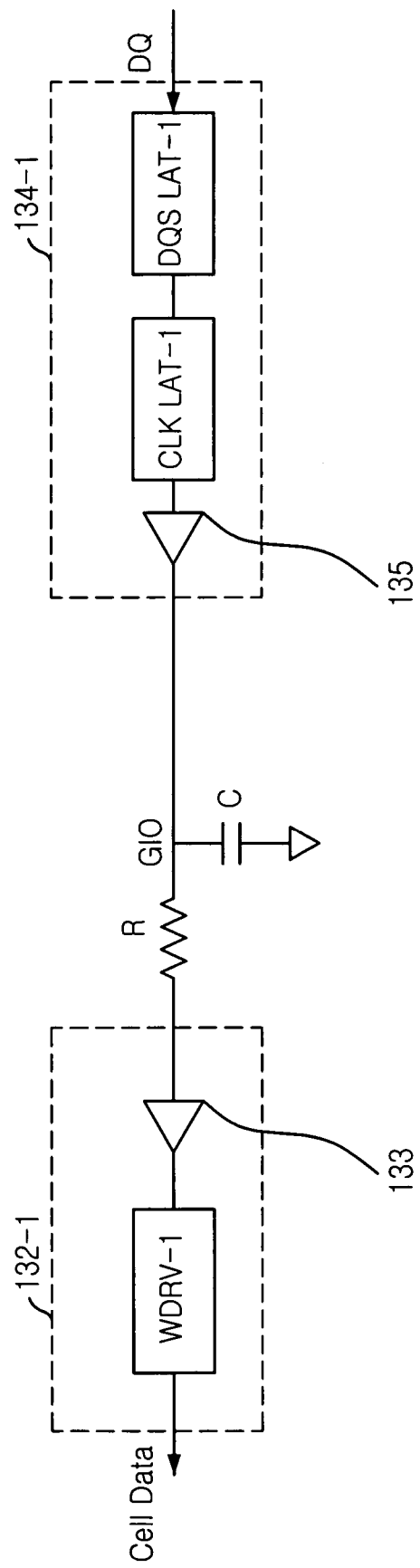
FIG. 8 is a circuit diagram showing an input/output line circuit for use in a write operation in accordance with the present invention.

FIG. 8 is a block diagram describing the global input/output lines in the peripheral region of the semiconductor memory device shown in FIG. 7.

It should be noted that only one of the global input/output lines GIO0 to GIO3 is illustrated in this drawing, and this illustrated global input/output line is expressed with a reference denotation GIO. Thus, only one of the write driver units WDRVs and one of the input data latch units DATA LATs shown in FIG. 7 are correspondingly illustrated, and said corresponding input/output write driver unit and said corresponding input data latch unit are denoted with a reference numeral 132-1 and 134-1, respectively.

As shown, the input data latch unit 134-1 for latching an inputted data, the global input/output line GIO for transferring the latched data and the write driver unit 132-1 for storing the data inputted from the global input/output line GIO into the bank 110 are disposed in the peripheral region.

The write driver unit 132-1 includes a data strobe latch device DQS LAT-1 and a clock latch device CLK LAT-1. Herein, the data strobe latch device DQS LAT-1 serves a role in latching an inputted data in response to a data strobe signal DQS, and the clock latch device CLK LAT-1 serves a role in latching the data primarily latched by the data strobe latch device DQS LAT-1 on the basis of a clock signal CLK because instructions and addresses of a chip are operated based on the clock signal CLK. That is, when if only the clock latch device CLK LAT-1 is used without the data strobe latch device DQS LAT-1, the data become skewed a lot between the chips since the clock signal CLK is widely applied to the chips and controllers. Thus, to overcome the above problem, the input data latch unit 134-1 in accordance with the preferred embodiment of the present invention is designed to latch the data twice through the use of the data strobe latch device DQS LAT-1 and the clock latch device CLK LAT-1.

However, the global input/output line GIO has high levels of a resistance R and a capacitance C that is not negligible. Thus, a second line driver 135 and a second line receiver 133 are allocated at the initial portion and the terminal portion of the global input/output line GIO, respectively in order to smoothly transmit the data without being affected by the resistance R and the capacitance C.

The global input/output line GIO is connected between the write driver unit 132-1 and the input data latch unit 134-1. The write driver unit 132-1 includes a write driver device WDRV-1 for transferring the data to a core line for use in the write operation connected to the core region and the second line receiver 133 for detecting the data transmitted from the global input/output line GIO. As described above, the input data latch unit 134-1 includes the second line driver 135 for outputting the data to the global input/output line GIO.

The line voltage VGIO generated from the line voltage generator 160 is inputted as a driving voltage for the write driver unit 132-1 and the input data latch unit 134-1. However, as shown in FIG. 8, the line voltage VGIO is supplied to the second line driver 135 and the second line receiver 132, while the internal voltage VINT or the external power voltage VDD is supplied to other circuit modules. In this case, it is possible to obtain an effect of improving a noise problem arising during the write operation at the global input/output line GIO.

Figure 9:
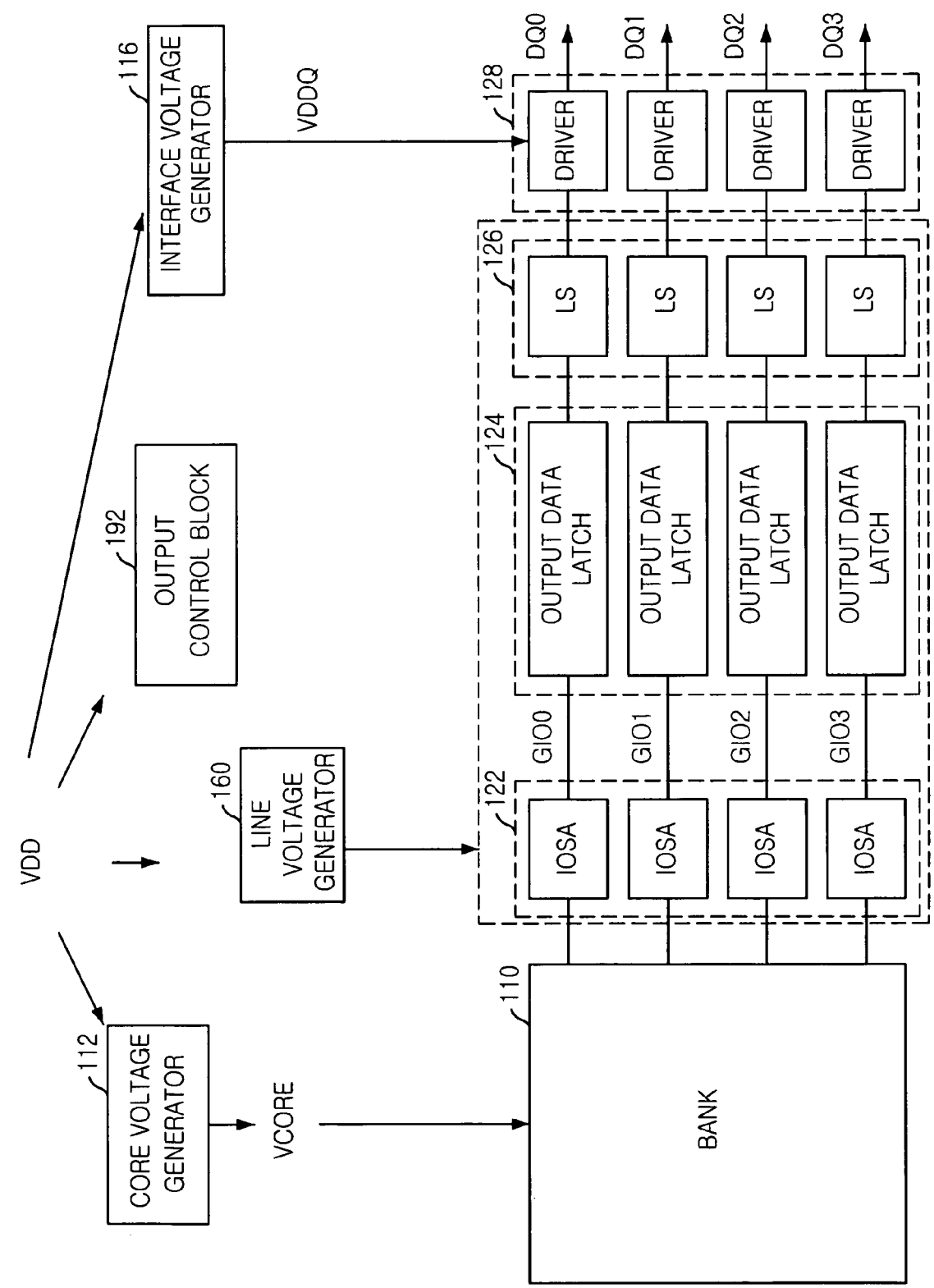
FIG. 9 is a block diagram showing a read path of a low voltage semiconductor memory device in accordance with the present invention.
Figure 10:
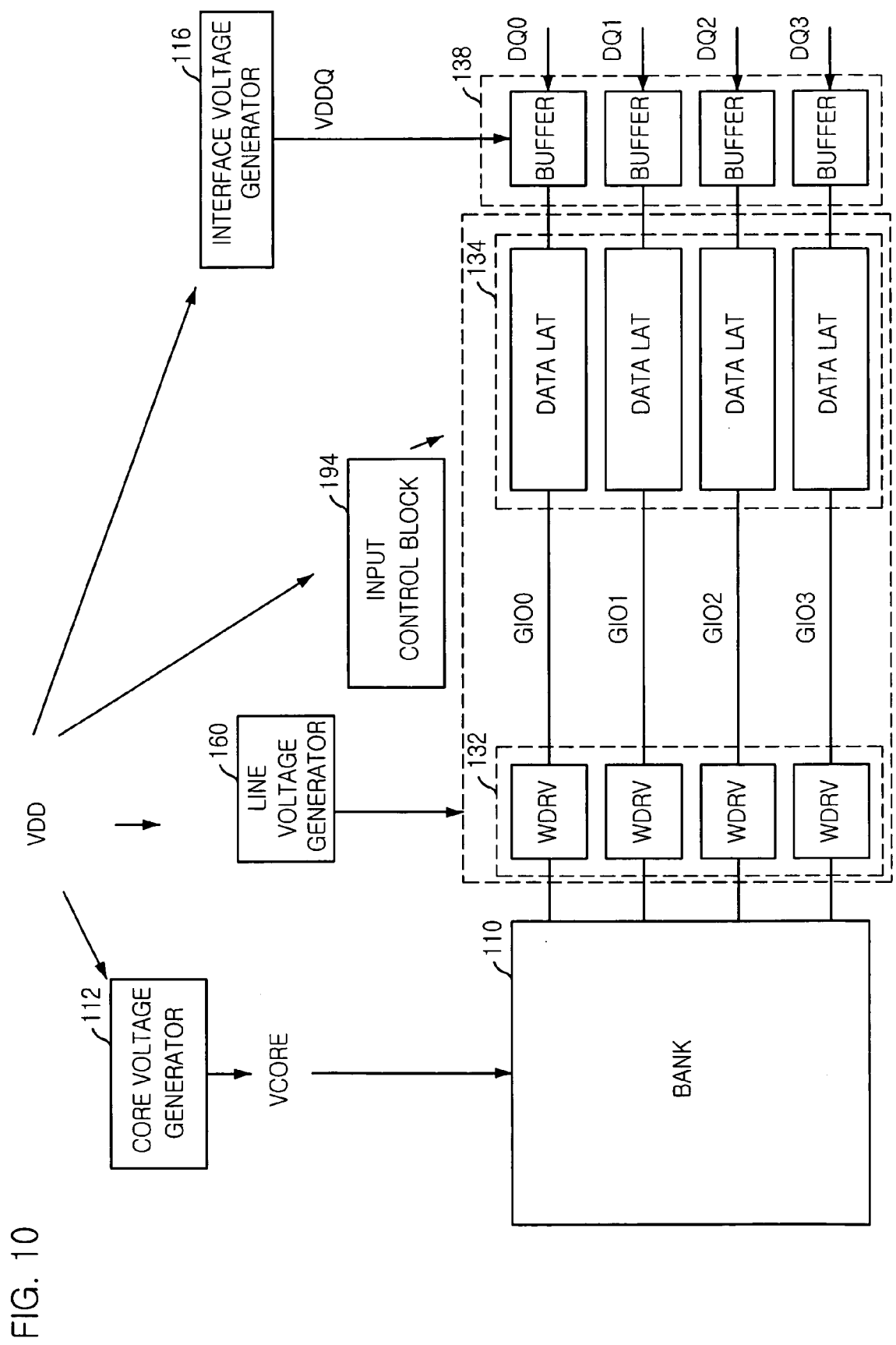
FIG. 10 is a block diagram showing a write path of the low voltage semiconductor memory device in accordance with the present invention.

FIG. 9 is block diagram showing a read path of data in a low voltage semiconductor memory device in accordance with the preferred embodiment of the present invention. FIG. 10 is a block diagram showing a write path of data in the low voltage semiconductor memory device in accordance with the preferred embodiment of the present invention. Herein, the same configuration elements described in FIGS. 5 to 8 are denoted with the same reference numerals, and detailed description of these elements will be omitted.

Also, the line voltage generator 160 and the supply of the line voltage VGIO in the low voltage semiconductor memory device are identical to the read operation and the write operation of the above-described semiconductor memory device. However, it is different from the external power voltage VDD serving as a driving voltage which is directly supplied to the input control block 194 and the output control block 192 for controlling the read/write operation.

It should be noted that the output data latch block 124 and the global input/output lines GIO0 to GIO3 both used during the read operation as described in FIGS. 5, 6, and 9 are called a read data latch block and the read global input/output lines GIO0 to GIO3, respectively. Also, the input data latch block 134 and the global input/output lines GIO0 to GIO3 both used during the write operation as described in FIGS. 7, 8 and 10 are called a write data latch block, the write global input/output lines GIO0 to GIO3, respectively.

Figure 11:
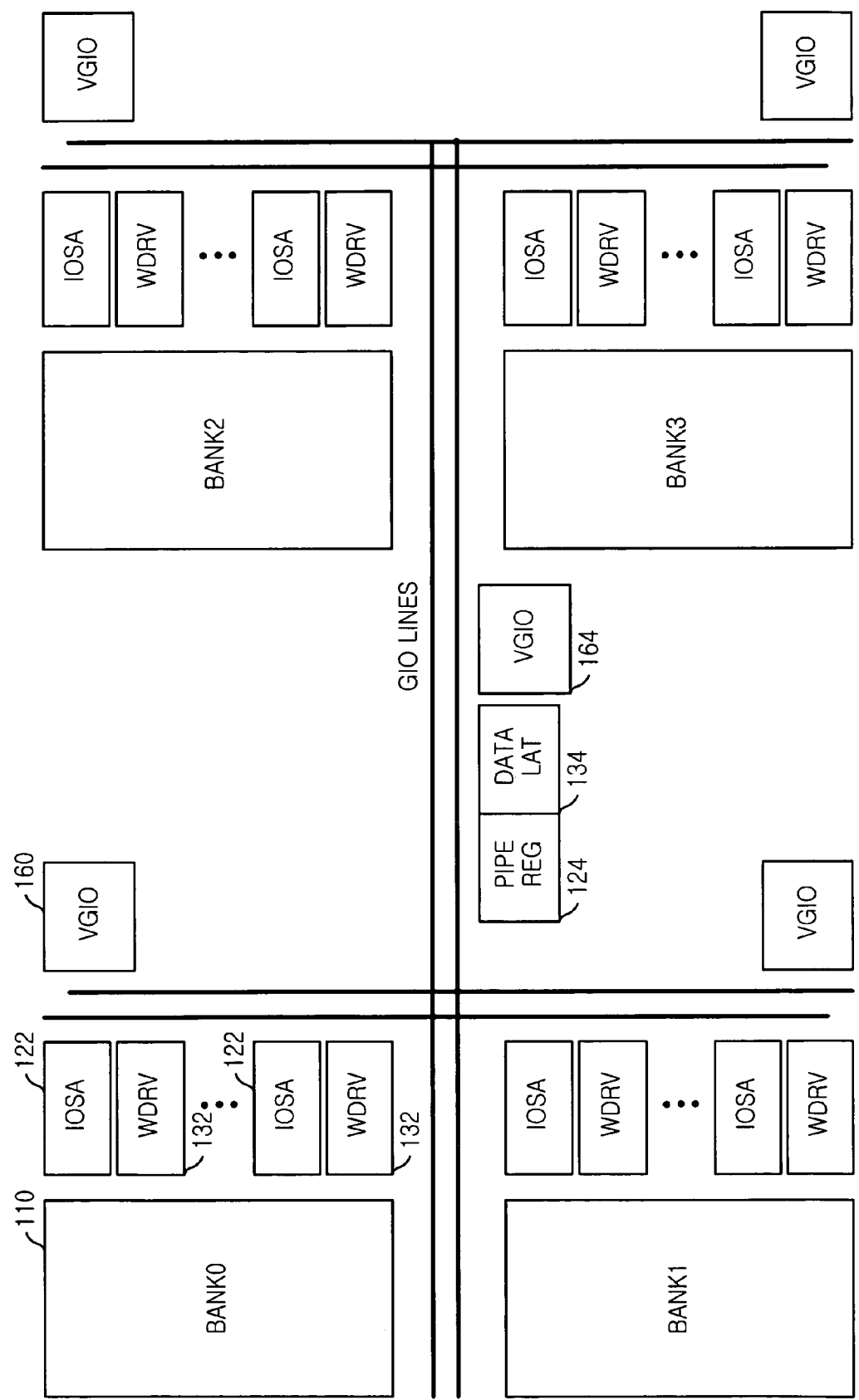
FIG. 11 is a diagram showing one embodied layout of an input/output line circuit in a semiconductor memory device in accordance with the present invention.
Figure 12:
FIG. 12 is a diagram showing another embodied layout of an input/output line circuit in a semiconductor memory device in accordance with the present invention.

FIG. 11 is a diagram showing a layout of a substrate structure of a semiconductor memory device, wherein each of the banks BANK0 to BANK3 includes one line voltage generator 160 in accordance with the preferred embodiment of the present invention. FIG. 12 is a diagram showing a layout of a substrate structure of a semiconductor memory device, wherein the line voltage generator 160 is placed for every two of the banks BANK0 to BANK3 in accordance with the preferred embodiment of the present invention. As shown, the same configuration elements described in FIGS. 5 to 10 are denoted with the same reference numerals, and a detailed description of these elements will be omitted.

According to the layouts shown in FIGS. 11 and 12, it is preferred that a peripheral line voltage generator 164 for supplying a line voltage to devices in the peripheral region and a core line voltage generator 162 for supplying a line voltage to devices in the core region are separately placed in order to effectively supply the line voltage.

The input/output sense amplifier block 122 and the write driver block 132 operate when a column address strobe (CAS) signal is activated. On the other hand, the read data latch block and the write data latch block retain latched data during the activation of the CAS signal.

Therefore, in accordance with the preferred embodiment of the present invention, although the line voltage generator is not limited within the scope described above, the line voltage generator can be still embodied to be activated during the activation of the CAS signal.

On the basis of the preferred embodiment of the present invention, the driving voltage is supplied to the input/output lines when the CAS signal activation time is shorter than that of a row address strobe (RAS). As a result, there is an effect of reducing power dissipation. Also, since the input/output lines are separated from the external power voltage, the input/output lines do not affect operations of other internal circuit modules and are not susceptible to noise generated by other external devices.

The present application contains subject matter related to Korean patent application No. KR 2004-0049912, filed in the Korean Patent Office on Jun. 30, 2004 the entire contents of which is incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device including a core region where memory cells are formed and a peripheral region where an input/output line circuit is formed, the semiconductor memory device comprising:
   a plurality of banks;
   a core voltage generation means for supplying a core voltage to the core region as a driving voltage;
   an internal voltage generation means for supplying an internal voltage to the peripheral region as a driving voltage; and
   a plurality of line voltage generation means for supplying a line voltage to the input/output line circuit as a driving voltage, wherein each line voltage generation means is arranged with one of each bank and each two banks.

2. The semiconductor memory device of claim 1, wherein the input/output line circuit includes:
   an output line block for outputting data stored in the core region to an external part; and
   an input line block for storing data inputted from the external part into the memory cells of the core region.

3. The semiconductor memory device of claim 2, wherein the output line block includes:
   an output sense amplifier unit for sensing data outputted from the core region and amplifying the sensed data;
   a plurality of global output lines for use in a read operation serving a role in receiving the amplified data and transferring the received data to the peripheral region; and
   a read latch unit for detecting the transferred data, latching the detected data and outputting the latched data to input/output pins.

4. The semiconductor memory device of claim 2, wherein the input line block includes:
   a write latch unit for detecting data inputted from an external part, latching the detected data and outputting the latched data;
   the plurality of global input/output lines for use in a write operation serving a role in receiving the latched data and transferring the received data to the core region; and
   a write driver unit for transmitting the data transferred from the plurality of global input/output lines to internal input/output lines of the core region.

5. The semiconductor memory device of claim 2, wherein the input/output line circuit further includes:
   an input control block for controlling the input line block; and
   an output control block for controlling the output line block, wherein the input control block and the output control block use the internal voltage as a driving voltage.

6. The semiconductor device of claim 1, further including an interface voltage generation means for supplying an interface voltage as a driving voltage to an input/output buffer block connected with an input/output pad block to connect the peripheral region with an external part.

7. An input/output line circuit, comprising:
   a plurality of global input/output lines for use in a read operation serving a role in transferring data from a core region to a peripheral region;
   an input/output sense amplifier unit for sensing data inputted to a plurality of internal input/output lines of the core region and amplifying the sensed data;
   a read latch unit for detecting the data transferred to the plurality of global input/output lines, latching the detected data for a predetermined time and outputting the latched data to input/output pins; and
   a plurality of read line voltage generation means enabled by a read enable signal and inputted with an external power voltage to supply a driving voltage to the input/output sense amplifying unit and the read latch unit, wherein each read line voltage generation means is arranged with either each global input/output line or each two global input/output lines.

8. The input/output line circuit of claim 7, wherein the read line voltage generation means includes:
   a core read line voltage generator for supplying a driving voltage to the input/output sense amplifying unit; and
   a peripheral read line voltage generator for supplying a driving voltage to the read latch unit.

9. The input/output line circuit of claim 8, wherein the read line voltage generation means is enabled when a column address strobe signal is enabled.

10. An input/output line circuit, comprising:
    a plurality of global input/output lines for use in a write operation serving a role in transferring data from a peripheral region to a core region;
    a write latch unit for detecting data inputted from input/output pins, latching the detected data and outputting the latched data to the plurality of global input/output lines for use in the write operation;
    a write driver unit for transferring the data inputted to the plurality of global input/output lines for use in the write operation to a plurality of internal input/output lines of the core region; and
    a plurality of write line voltage generation means enabled by a write enable signal and inputted with an external power voltage to supply a driving voltage to the write latch unit and the write driver unit, wherein each write line voltage generation means is arranged with either each alobal input/output line or each two global input/output lines.

11. The input/output line circuit of claim 10, wherein the write line voltage generation means includes:
    a core write line voltage generator for supplying a driving voltage to the write driver unit; and
    a peripheral write line voltage generator for supplying a driving voltage to the write latch unit.

12. The input/output circuit line of claim 11, wherein the write line voltage generator is enabled when a column address strobe signal is enabled.

13. An input/output line circuit, comprising:
    a plurality of global input/output lines for inputting/outputting data between a core region and a peripheral region;
    an input/output sense amplifying unit for sensing data inputted to internal input/output lines of the core region and amplifying the sensed data;
    a read latch unit for detecting the data inputted to the plurality of global input/output lines, latching the detected data for a predetermined time and outputting the latched data to input/output pins;
    a write latch unit for detecting the data inputted from input/output pins, latching the detected data and outputting the latched data to the plurality of global input/output lines;
    a write driver unit for transferring the data inputted to the plurality of global input/output lines to the internal input/output lines of the core region; and
    a plurality of line voltage generation means for supplying a driving voltage to the input/output sense amplifying unit and the read latch unit as the line voltage generation means is enabled by a read enable signal and inputted with an external power voltage and for supplying a driving voltage to the write latch unit and the write driver unit as the line voltage generation means is enabled by a write enable signal and inputted with an external power voltage, wherein each line voltage generation means is arranged with either each global input/output line or each two global input/output lines.

14. The input/output line circuit of claim 13, wherein the line voltage generation means includes:
- a read line voltage generator for supplying a driving voltage to the input/output sense amplifying unit and the read latch unit; and
- a write line voltage generator for supplying a driving voltage to the write latch unit and the write driver unit.

15. The input/output line circuit of claim 13, wherein the line voltage generation means includes:
- a core line voltage generator for supplying a driving voltage to the read latch unit and the write driver unit; and
- a peripheral line voltage generator for supplying a driving voltage to the input/output sense amplifying unit and the write latch unit.

16. The input/output line circuit of claim 13, wherein the line voltage generation means is enabled when a column address strobe signal is enabled.

* * * * *

UNITED STATES PATENT AND TRADEMARK OFFICE
CERTIFICATE OF CORRECTION

| | | |
|---|---|---|
| PATENT NO. | : 7,200,065 B2 | Page 1 of 1 |
| APPLICATION NO. | : 11/022119 | |
| DATED | : April 3, 2007 | |
| INVENTOR(S) | : Lee | |

It is certified that error appears in the above-identified patent and that said Letters Patent is hereby corrected as shown below:

In claim #10, Column 10, line 36, please delete "alobal" and insert -- global --.

Signed and Sealed this

Seventh Day of August, 2007

JON W. DUDAS
*Director of the United States Patent and Trademark Office*